(12) United States Patent
Tsukiji

(10) Patent No.: US 6,878,984 B2
(45) Date of Patent: Apr. 12, 2005

(54) NON-VOLATILE FLASH MEMORY HAVING A SPECIFIC DIFFERENCE BETWEEN SOURCE/FLOATING GATE AND DRAIN/FLOATING GATE OVERLAPPED PORTIONS

(75) Inventor: Masaru Tsukiji, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 255 days.

(21) Appl. No.: 09/761,693

(22) Filed: Jan. 18, 2001

(65) Prior Publication Data

US 2001/0008786 A1 Jul. 19, 2001

(30) Foreign Application Priority Data

Jan. 19, 2000 (JP) .................................. 2000-014139

(51) Int. Cl.⁷ ............................................ H01L 29/788
(52) U.S. Cl. .................... 257/315; 257/316; 257/317; 257/318
(58) Field of Search .................... 257/315–322; 365/85.01

(56) References Cited

U.S. PATENT DOCUMENTS 5,190,887 A * 3/1993 Tang et al.

FOREIGN PATENT DOCUMENTS

| JP | 4-253374 A | 9/1992 |
|---|---|---|
| JP | 6-140635 A | 5/1994 |
| JP | 6-283721 A | 10/1994 |
| JP | 7-211809 A | 8/1995 |
| JP | 9-199617 A | 7/1997 |
| JP | 2003-179171 A | 6/2003 |

OTHER PUBLICATIONS

M. Kato et al., "A Shallow–Trench–Isaolation Flash Memory Technology with a Source–Bias Programming Method", 1996, *IEEE Technical Digest of IEDM*, pp. 177–180.

* cited by examiner

*Primary Examiner*—Fetsum Abraham
(74) *Attorney, Agent, or Firm*—Young & Thompson

(57) ABSTRACT

A structure of a non-volatile flash memory, in which a punch-through current is suppressed and the area of a memory cell is reduced, is provided. The non-volatile flash memory being a NOR type non-volatile flash memory provides floating gates and a common source line, and drains. And at the structure of the non-volatile flash memory, a region overlapped one of the drains and one of the floating gates in a memory cell is larger than a region overlapped the common source and one of the floating gates in the memory cell.

6 Claims, 7 Drawing Sheets

F I G. 4
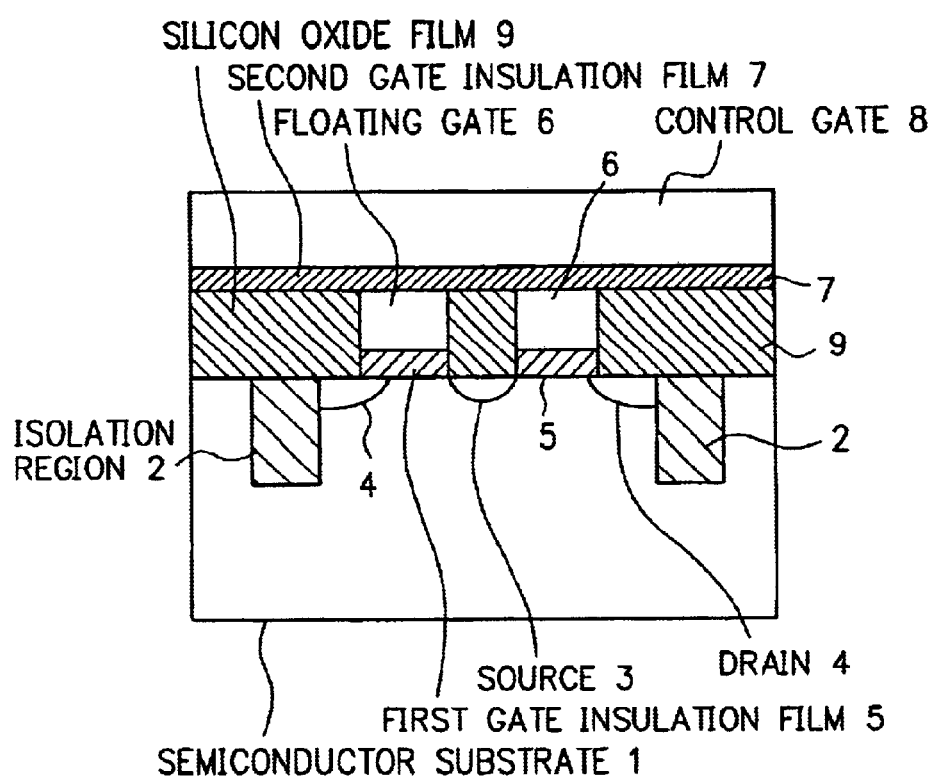

F I G. 5
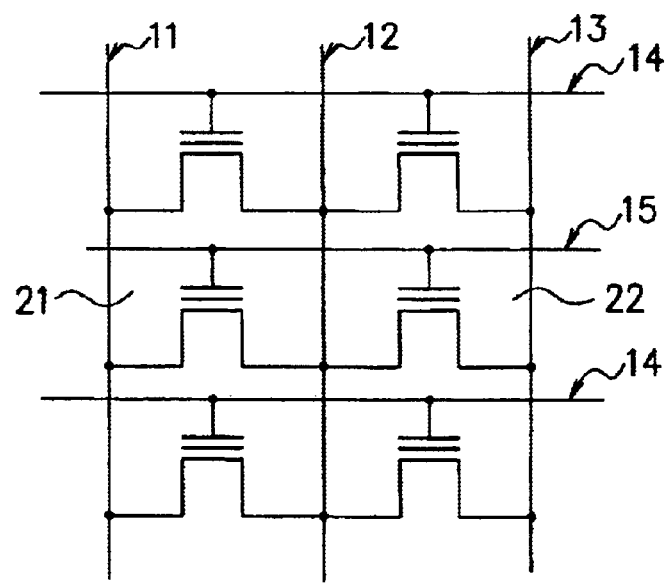
F I G. 6
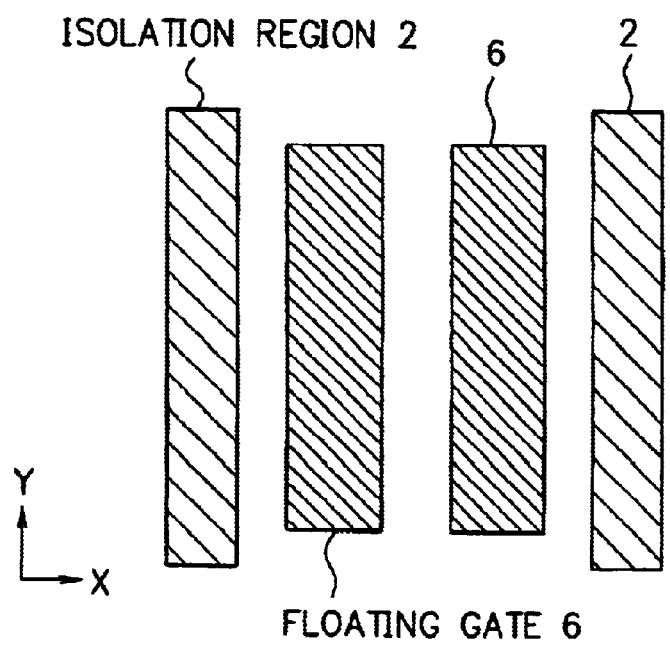

F I G. 7A
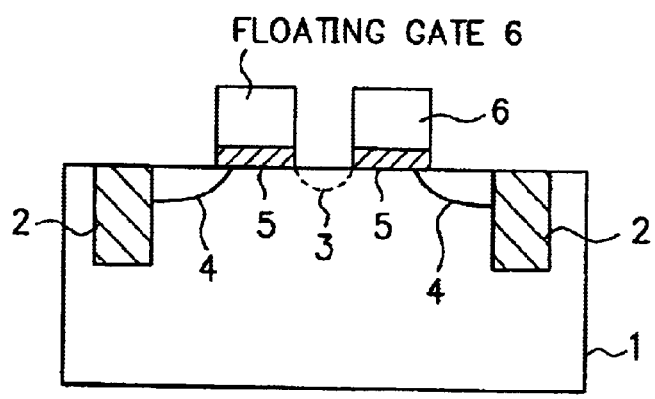
F I G. 7B
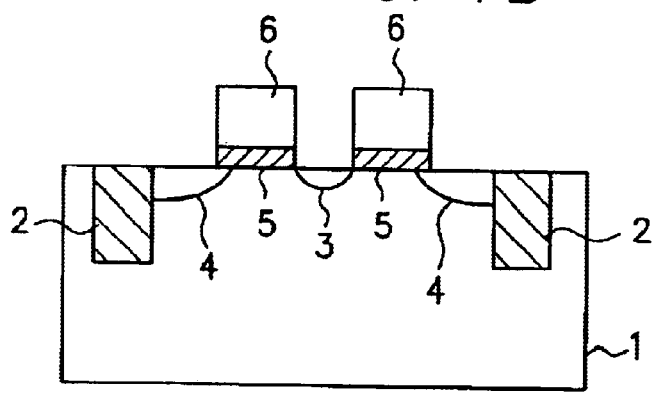
F I G. 7C
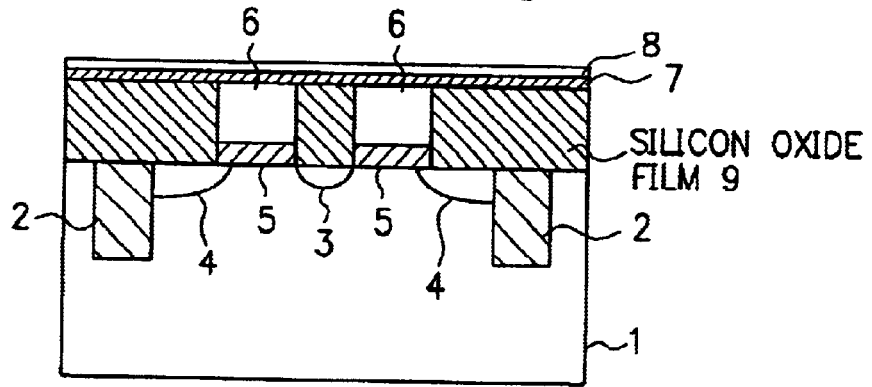

—●—: BY WIDTH OVERLAPPED FLOATING GATE AND DRAIN

—○—: BY WIDTH OVERLAPPED FLOATING GATE AND SOURCE

NON-VOLATILE FLASH MEMORY HAVING A SPECIFIC DIFFERENCE BETWEEN SOURCE/FLOATING GATE AND DRAIN/FLOATING GATE OVERLAPPED PORTIONS

BACKGROUND OF THE INVENTION

The present invention relates to a structure and a manufacturing method of a non-volatile flash memory.

DESCRIPTION OF THE RELATED ART

As one of the data writing operation to a non-volatile flash memory, there is a method ejecting electrons from a region overlapped a floating gate and a drain by using a Fauler-Nordheim (FN) type tunneling.

Referring to drawings, this electron ejecting operation is explained. FIG. 1 is a sectional view at the A—A line of FIG. 2 of a structure of a conventional non-volatile flash memory. As shown in FIG. 1, at the conventional non-volatile flash memory, isolation regions 2, a source 3, and a drain 4 are formed on a semiconductor substrate 1. And on the surface of the semiconductor substrate 1 between the source 3 and the drain 4, a first gate insulation film 5 being a tunnel film, a floating gate 6, a second gate insulation film 7 being an inter poly silicon film, and a control gate 8 are formed in order from the bottom. And a silicon oxide film 9 is disposed at the both sides of the first gate insulation film 5 being the tunnel film and the floating gate 6 in the sectional view. And there is an overlapped region between the floating gate 6 and the drain 4 through a part of the first gate insulation film 5 being the tunnel film.

When data are written in the non-volatile flash memory, for example, a negative voltage −12V is applied to the floating gate 6 and a positive voltage +5V is applied to the drain 4. With this, electrons are ejected from the floating gate 6 to the drain 4 through the first gate insulation film 5 being the tunnel film at the overlapped region. In order to make the data writing speed fast, generally, the overlapped region between the floating gate 6 and the drain 4 are made to be large. In case that this overlapped region is small, a depletion layer, extended in the drain direction from the junction region between the drain 4 and the semiconductor substrate 1, covers the overlapped region. And the voltage applied between the floating gate 6 and the drain 4 is divided and a part of this divided voltage flows into the depletion layer. Consequently, the voltage applying to the first gate insulation film 5 being the tunnel film is made to be small, and the data writing is made to be slow. In order to avoid this, the overlapped region is made to be large. In order to make the overlapped region large, it is necessary that the drain 4 is made to push to the first gate insulation film 5 being the tunnel by heat treatment.

Further, in order to make the data writing speed fast, it is effective to make the drain voltage high at the time of the data writing, and this applying voltage becomes higher than a drain voltage at data reading at normal operation. In this case, at a micro processed semiconductor device, a punch-through current is generated between the drain 4 and the source 3 at the data writing, and this causes that the drain electric potential is made to be lower than a desired value. Consequently, there is a problem that the data writing speed is made to be slow.

In order to suppress the generation of the punch-through current, the source, which is not used at the data writing, is disposed to a farther position. However, under the situation that the semiconductor device has been manufacture by the further micro processes, it has been impossible that the punch-through current is suppressed by this method.

In order to solve this problem, a method to suppress the punch-through current by applying the same voltage to the source 3 and the drain 4 at the data writing is proposed at a technical report written by, M. Kato, et al., "A Shallow-Trench-Isolation Flash Memory Technology with a Source-Bias Programming Method, "IEEE Technical Dig. of IEDM 1996, pp. 177–180.

FIG. 2 is a plane view showing a structure of the conventional non-volatile flash memory. Referring to FIG. 2, this method is explained. As shown in FIG. 2, at a NOR type array structure, the same positive voltage is applied to a bit line 11 (drain 4) and a source line (source 3) of a selected memory cell, and a negative voltage is applied to a selected word line 15 (control gate 8). With this, the electrons are ejected from the floating gate 6 to the drain 4 and the source 3, without generating the punch-through current between the source 3 and the drain 4.

On the other hand, at a NOR type array structure, in order to reduce the area of the memory cell, there is a case that a common source line structure is utilized.

However, at the conventional method in which the same voltage is applied to the source 3 and the drain 4 at the data writing, the common source line structure can not be used, therefore the punch-through current can be suppressed, but there is a problem that the area of the array can not be reduced.

And at the conventional common source line structure, when the same high voltage is applied to the source 3 and the drain 4 at the data writing, this applied positive voltage is also applied to the source 3 in an adjacent memory cell. Since the negative voltage is applied to the word line (control gate), electrons are ejected from the floating gate 6 to the source 3 in the adjacent memory cell, and the data are written in the adjacent unselected memory cell.

SUMMARY OF THE INVENTION

It is therefore an object of the present invention to provide a structure of a non-volatile flash memory manufacturing by micro processes, in which the generation of a punch-through current is suppressed and a common source line structure being capable of reducing a memory cell area can be also used, and a method in which data writing to an unselected memory cell is effectively prevented by using this structure.

According to a first aspect of the present invention, for achieving the object mentioned above, there is provided a structure of a non-volatile flash memory that is a NOR type non-volatile flash memory, which provides floating gates and a common source line. And at the structure, a region overlapped one of drains and one of the floating gates in a memory cell is larger than a region overlapped a source and one of the floating gates in the memory cell.

According to a second aspect of the present invention, at a structure of a non-volatile flash memory that is a NOR type non-volatile flash memory, which provides floating gates and a common source line, the difference (a–b) between a region "a" overlapped one of drains and one of the floating gates in a memory cell, and a region "b" overlapped a source and one of the floating gates in the memory cell is 0.02 $\mu$m or more.

According to a third aspect of the present invention, at a structure of a non-volatile flash memory that is a NOR type non-volatile flash memory, which provides floating gates and a common source line, the impurity gradient distribution of a source in a memory cell at the adjacent position, where the source joints a semiconductor substrate, is formed to be gradual.

According to a fourth aspect of the present invention, in the first and second aspects, at a structure of a non-volatile flash memory that is a NOR type non-volatile flash memory, which provides floating gates and a common source line, the source is composed of first sources and a second source, and the first sources and the second source are formed in a state that the first and second sources are contacted with one another, and the first sources are formed at regions overlapped with the floating gates.

According to a fifth aspect of the present invention, in the fourth aspect, at a structure of a non-volatile flash memory that is a NOR type non-volatile flash memory, which provides floating gates and a common source line, the impurity concentration of the second source is higher than that of the first sources.

According to a sixth aspect of the present invention, in the fourth aspect, at a structure of a non-volatile flash memory that is a NOR type non-volatile flash memory, which provides floating gates and a common source line, the source composed of the first and second sources is formed in a state that the first and second sources are unified.

According to a seventh aspect of the present invention, there is provided a structure of a non-volatile flash memory that provides plural memory cells isolated by isolation regions. The structure of the non-volatile flash memory provides plural floating gates, plural drains, and one source. And at the structure, the one source is a common source for the plural memory cells, and impurity concentration of the one source is lower than that of the plural drains.

According to an eighth aspect of the present invention, in the seventh aspect, the plural memory cells are composed as a pair.

According to a ninth aspect of the present invention, in the seventh aspect, the number of the plural floating gates and the number of the plural drains are the same.

According to a tenth aspect of the present invention, there is provided a manufacturing method of a non-volatile flash memory that provides plural memory cells which are isolated by isolation regions, and each of the plural memory cells provides a floating gate, a drain, and one source. And heat treatment after diffused impurity to the one source is suppressed compared with heat treatment after diffused impurity to the drains.

According to an eleventh aspect of the present invention, in the tenth aspect, impurity concentration of the one source is lower than that of the plural drains.

According to a twelfth aspect of the present invention, in the tenth aspect, the impurity gradient distribution of the one source in the plural memory cells at the adjacent position, where the one source joints a semiconductor substrate, is formed to be gradual.

According to the present invention, at a NOR type flash memory having a common source line, there is provided a structure in which a region overlapped a drain and a floating gate in a memory cell is large and a region overlapped a source and the floating gate in the memory cell is small. And at the NOR type non-volatile flash memory, the impurity gradient distribution of the source in the memory cell at the adjacent position, where the source joints a semiconductor substrate, is formed to be gradual. And when data are written in the NOR type flash memory, a negative voltage is applied to a selected word line, and the same positive voltage is applied to a selected bit line and a selected source line. With this, a punch-through current between the source and the drain in the selected memory cell is suppressed, and electrons can be ejected from the floating gate to the drain. At this time, the positive voltage is applied to a source in an adjacent memory cell and a negative voltage is applied to a ward line in the adjacent memory cell. However, the region overlapped the source and the floating gate is small, therefore, the ejection of electrons from the floating gate to the source does not occur. Consequently, in case that this adjacent memory cell is an unselected memory cell, data error writing to the unselected memory cell does not occur. Or since the impurity concentration distribution in the source is gradual, when the positive voltage is applied to the source, a depletion layer extends in the source, and the voltage applied between the floating gate and the source is divided and a part of this divided voltage flows into the depletion layer, consequently the voltage applying to a tunnel film decreases. Therefore, electrons are not ejected from the floating gate to the source, and data error writing to the unselected memory cell does not occur.

BRIEF DESCRIPTION OF THE DRAWINGS

The objects and features of the present invention will become more apparent from the consideration of the following detailed description taken in conjunction with the accompanying drawings in which:

FIG. 4 is a sectional view at the A—A line of FIG. 3 of the structure of the first embodiment of the non-volatile flash memory of the present invention;

FIG. 5 is an equivalent circuit of the structure of the first embodiment of the non-volatile flash memory of the present invention;

FIG. 6 is a plane view showing isolation regions and floating gates of the first embodiment of the non-volatile flash memory of the present invention;

FIGS. 7A, 7B, and 7C are diagrams showing manufacturing processes at a manufacturing method of the first embodiment of the non-volatile flash memory of the present invention;

DESCRIPTION OF THE PREFERRED EMBODIMENTS

Figure 1:
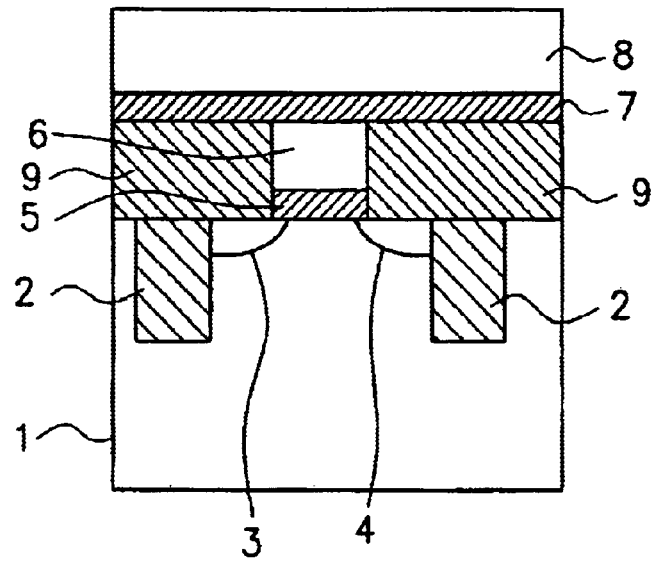
FIG. 1 is a sectional view at the A—A line of FIG. 2 of a structure of a conventional non-volatile flash memory.
Figure 2:
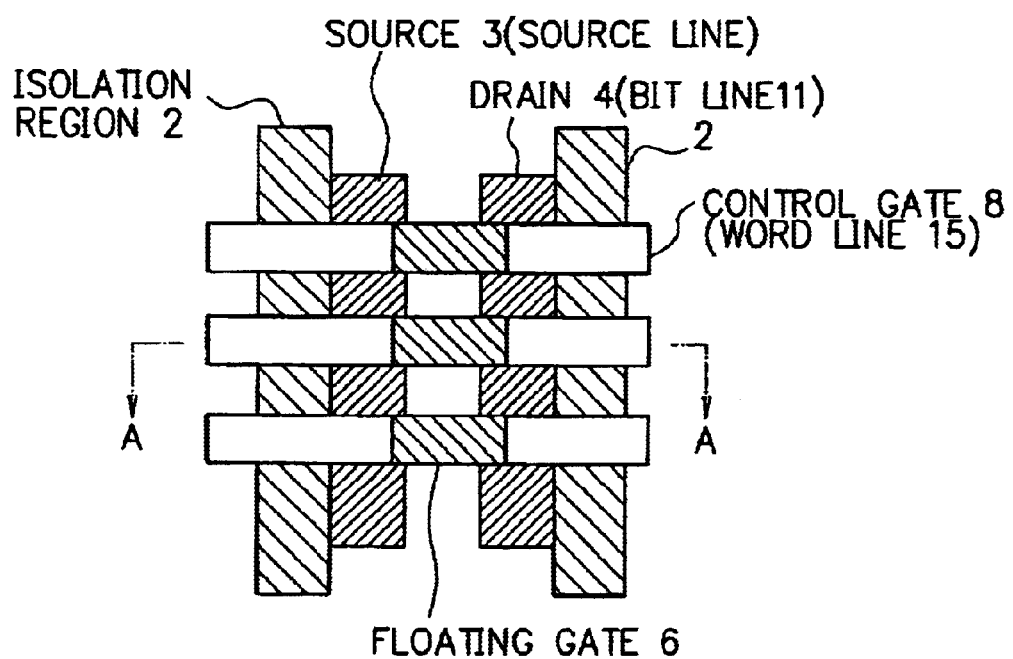
FIG. 2 is a plane view showing a structure of the conventional non-volatile flash memory.
Figure 3:
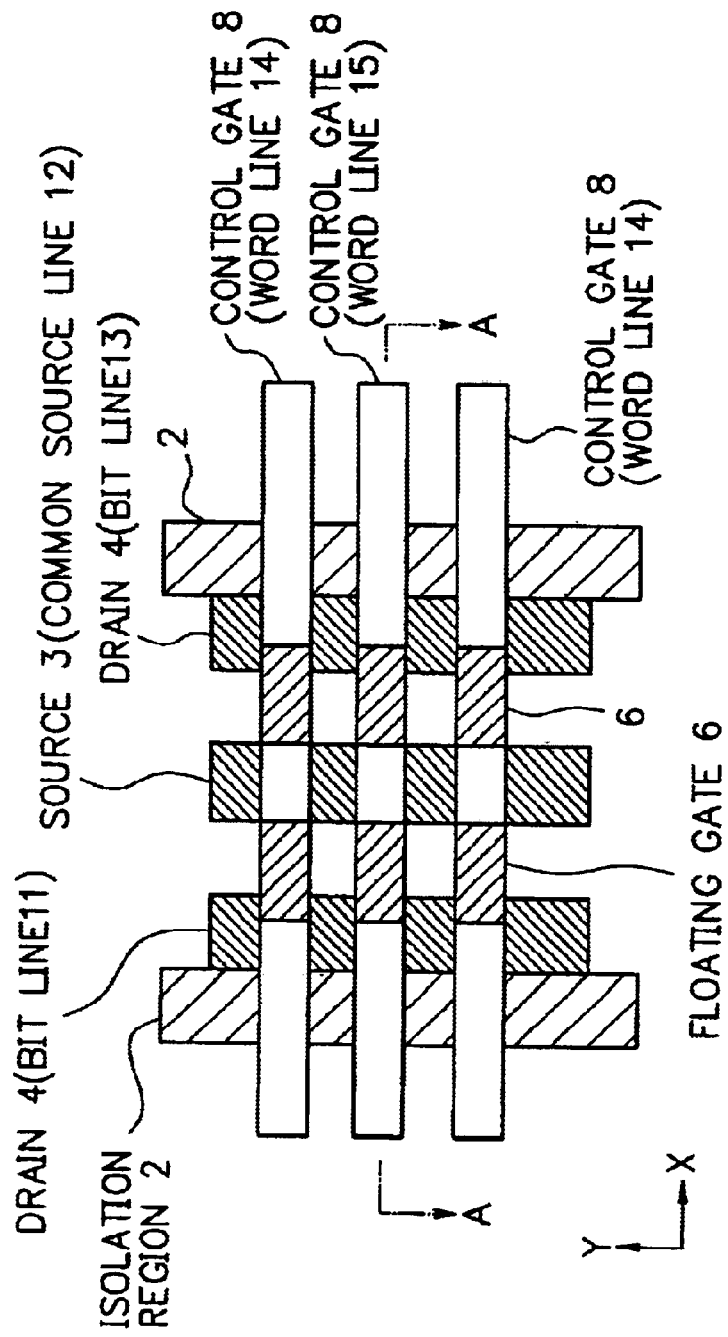
FIG. 3 is a plane view showing a structure of a first embodiment of a non-volatile flash memory of the present invention.

Referring now to the drawings, embodiments of the present invention are explained in detail. At the embodiment of the present invention, each function being equivalent to each function at the conventional non-volatile flash memory has the same reference number. FIG. 3 is a plane view showing a structure of a first embodiment of a non-volatile flash memory of the present invention. As shown in FIG. 3, at the structure of the first embodiment of the non-volatile flash memory of the present invention, isolation regions 2, a source 3, and drains 4 are disposed in the Y direction. The source 3 and the drains 4 are formed as diffusion layer wiring, and the source 3 works as a source line and the drains 4 works as bit lines 11 and 13. The source 3 works as a common source line 12 to two memory cells disposed at right and left. And floating gates 6 are formed between the source 3 and one of the drains 4, and the source 3 and the other drain 4. Control gates 8 are disposed in the X direction and work as word lines 14 and 15.

FIG. 4 is a sectional view at the A—A line of FIG. 3 of the structure of the first embodiment of the non-volatile flash memory of the present invention. As shown in FIG. 4, the isolation regions 2, the source 3, and the drains 4 are formed on the surface of a semiconductor substrate 1. And on the surface of the semiconductor substrate 1 between the source 3 and one of the drains 4, a first gate insulation film 5 being a tunnel film, a floating gate 6, a second gate insulation film 7 being an inter poly silicon film, and the control gate 8 are formed in order from the bottom. And at the both sides of the floating gate 6 and the first gate insulation film 5 in the sectional view, a silicon oxide film 9 is formed. And there is a large overlapped region between the floating gate 6 and one of the drains 4 through a part of the first gate insulation film 5 being the tunnel film. And an overlapped region between the source 3 and the floating gate 6 is small. And at the position between the source 3 and the other drain 4, the same structure mentioned above is composed.

FIG. 5 is an equivalent circuit of the structure of the first embodiment of the non-volatile flash memory of the present invention. Referring to FIG. 5, data writing operation is explained. At the time of the data writing, for example, a positive voltage +5V is applied to a selected bit line 11 (drain 4) and a common source line 12 (source 3), and a negative voltage −12 V is applied to a selected word line 15 (control gate 8). An unselected bit line 13 and unselected word lines 14 are grounded.

At this structure, a depletion layer extends in the source 3, and the voltage applying to the position between the floating gate 6 and the source 3 at a selected memory cell 21 is divided and a part of this divided voltage flows into the depletion layer, and a voltage applying to the first gate insulation film 5 being the tunnel film decreases. Consequently, the ejection of electrons from the floating gate 6 to the source 3 does not occur, and data error writing to an unselected memory cell 22 adjacent to the selected memory cell 21 does not occur. Therefore, by applying the same voltage to the source 3 and the drain 4, the punch-through current is prevented. And also, the source 3 is the common source line 12, therefore, the area of the memory cell can be reduced, and there is an effect that the degree of the integration further increases.

In FIG. 3, the floating gates 6, described by oblique lines disposed at the near center part of the word line 14 (control gate 8), contact with the lower surface of the word line 14. And the word lines 14 and 15 (control gates 8), and the bit lines 11 and 13 (drains 4) are not connected electrically. And the word lines 14 and 15 (control gates 8), and the common source line 12 (source 3) are not connected electrically. And the word lines 14 and 15 are disposed at the upper position of the bit lines 11 and 13, and the common source line 12, however this position can be changed inversely.

FIG. 6 is a plane view showing the isolation regions 2 and the floating gates 6 of the first embodiment of the non-volatile flash memory of the present invention. As shown in FIG. 6, the floating gates 6 are disposed in a state that the floating gates 6 extend uniformly in the Y direction by patterning. However, actually, the floating gates 6 are disposed in a state that the floating gates 6 are separated as shown in FIG. 3.

FIGS. 7A, 7B, and 7C are diagrams showing manufacturing processes at a manufacturing method of the first embodiment of the non-volatile flash memory of the present invention. Referring to FIGS. 7A, 7B, and 7C, the manufacturing processes at the manufacturing method of the present invention are explained. As shown in FIG. 7A, first, for example, a silicon oxide film is embedded on the surface of a semiconductor substrate 1 and isolation regions 2 are formed. Next, a first gate insulation film 5 having about 10 nm thickness is formed on the whole surface by using dried oxygen of 900° C. by a thermal oxidation method. Further, in order to form floating gates 6 on the whole surface, a polycrystal silicon film having about 100 nm is formed on the whole surface of the first gate insulation film 5. At the first embodiment, in order to reduce electric resistance, phosphorus (P) is implanted to the polycrystal silicon film by an ion implantation method. After this, a patterning is applied to the polycrystal silicon film by an existing method, and the floating gates 6 are formed. As shown in FIG. 6, the floating gates 6 are patterned in a state that the floating gates 6 uniformly extend in the Y direction. However, actually, the floating gates 6 are disposed in a state that the floating gates 6 are separated as shown in FIG. 3. A region, in which a source is formed, is covered with a mask, and after this, for example, arsenic (As) being a N type impurity is implanted by $3 \times 10^{15}$ cm$^{-2}$, and drains 4 are formed. After removing the mask, the arsenic (As) in the drains 4 is diffused by heat treatment, regions overlapped the floating gates 6 and the drains 4 are made to be large.

Next, as shown in FIG. 7B, arsenic (As) of $5 \times 10^{13}$ cm$^{-2}$ is implanted to the whole surface, and the source 3 is formed. After this, when the heat treatment is suppressed, regions overlapped the source 3 and the floating gates 6 are made to be small. Or the regions overlapped the source 3 and the floating gates 6 are made not to exist, even in this case, there is no problem when the end of the floating gate 6 is disposed on the end line of the source 3 and an electrical overlap does not exist between them.

And, as shown in FIG. 7C, a silicon oxide film 9 is disposed on the whole surface by, for example, a CVD (chemical vapor deposition) method. After this, the silicon oxide film 9 on the source 3 and the drains 4 is made to stay and the upper surfaces of the floating gates 6 are made to expose by an etching back or a CMP (chemical mechanical polishing) method.

Next, a multi-layer film, composed of a silicon oxide film having about 8 nm thickness, a silicon oxide film having about 10 nm thickness, and a silicon oxide film having about 8 nm thickness, is formed on the whole surface as a second gate insulation film 7. And further, as a material for control gates 8, a polycrystal silicon film containing phosphorus (P) having about 100 nm, and an eutectic film having about 100 nm composed of tungsten and silicon are formed on the second gate insulation film 7. After this, the control gates 8 are formed by applying a patterning to this material, and the structure shown in FIG. 4 at the first embodiment of the non-volatile flash memory of the present invention is formed.

Figure 8:
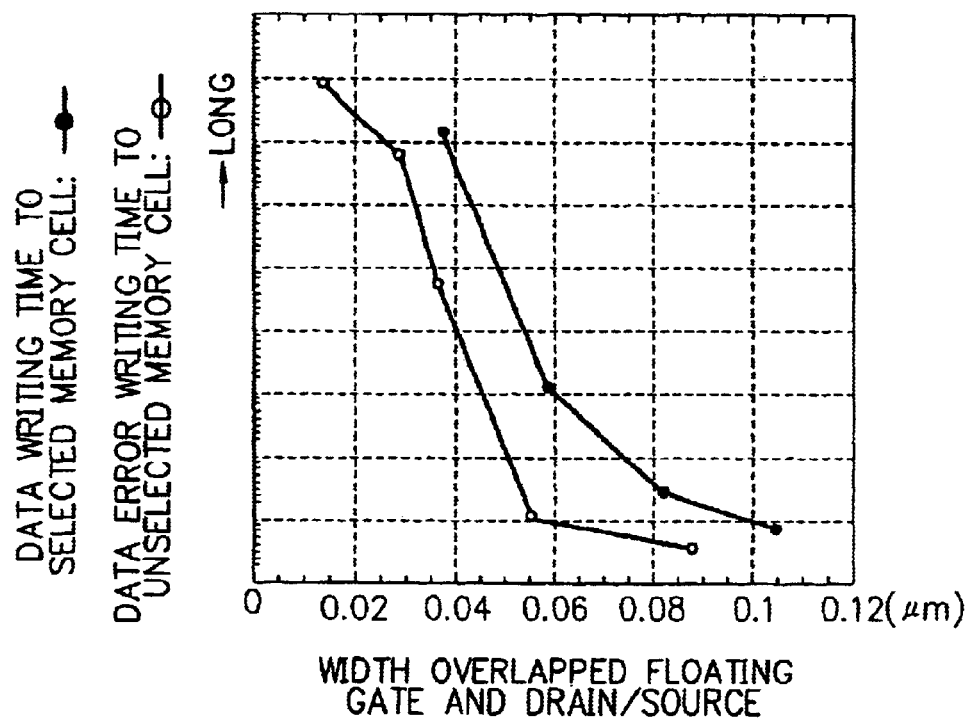
FIG. 8 is a graph showing a relation, between a width overlapped a floating gate and a drain, and data writing time, and a relation, between a width overlapped the floating gate and a source, and data error writing time.

FIG. 8 is a graph showing a relation, between a width overlapped the floating gate 6 and the drain 4, and data writing time, and a relation, between a width overlapped the floating gate 6 and the source 3, and data error writing time. In FIG. 8, the difference between two dotted lines in the time scale is one digit. In this, the data error writing time is defined in the following way. In case that the drains 4 are grounded and a positive voltage is applied to the source 3, a few electrons are ejected from the floating gate 6 to the source 3, and the threshold value of the memory cell is decreased. At this time, a requiring time, in which the threshold value of the memory cell decreases by 0.5 V, is defined as the data error writing time. As the bias condition, a negative voltage −12V is applied to the control gates 8 and a positive voltage +5V is applied to the drains 4 and the source 3.

At the present invention, the difference (a−b) being a margin between a width "a" overlapped the floating gate 6 and the drain 4 shown in a polygonal line used ●, and a width "b" overlapped the floating gate 6 and the source 3 shown in a polygonal line used ○ is required to be more than one digit. For example, when the width overlapped the floating gate 6 and the source 3 is about 0.04 μm on the polygonal line used ○, and the width overlapped the floating gate 6 and the drain 4 is about 0.06 μm on the polygonal line used ●, the time difference (a−b) becomes about one digit. This signifies that the difference (a−b) is desirable to be more than 0.02 μm at the present invention.

And it is desirable that the width "a" overlapped the floating gate 6 and the drain 4 is more than 0.03 μm, and the width "b" overlapped the source 3 and the floating gate 6 is less than 0.01 μm. This shows at the left upper part in FIG. 8.

As shown in FIG. 8, it is more desirable that the difference (a−b) is more than 0.05 μm. Especially, in case that the width "a" overlapped the floating gate 6 and the drain 4 is made to be more than 0.08 μm, and the width "b" overlapped the floating gate 6 and the source 3 is made to be less than 0.03 μm, at the time difference between the data writing time of the selected memory cell and the data error writing time of the unselected memory cell, a margin being more than 5 digits is generated, and the data error writing does not occur actually. This shows in FIG. 8, when the width overlapped the floating gate 6 and the source 3 is about 0.03 μm on the polygonal line used ○, and the width overlapped the floating gate 6 and the drain 4 is about 0.08 μm on the polygonal line used ●, the time difference (a−b) becomes about 5 digits.

Next, a second embodiment of a structure of the non-volatile flash memory of the present invention is explained. At the first embodiment, the region overlapped the source 3 and the floating gate 6 is made to be small. However, at the second embodiment, the impurity gradient of the source 3 at the adjacent position, where the source 3 joints the semiconductor substrate 1, is made to be a gradual distribution. Consequently, when a positive voltage is applied to the source 3 at the data writing time, a large depletion layer extends in the source 3, and the voltage divided into the first gate insulation film 5 being the tunnel film is reduced largely. Therefore, there is an effect that the data error writing to the unselected memory cell is further suppressed. In order to realize the second embodiment, arsenic (As) of $3\times10^{14}$ cm$^{-2}$ is implanted on the whole surface, and the source 3 is formed, and after this, diffusion is applied by the heat treatment. The other processes are the same that the first embodiment has.

Figure 9:
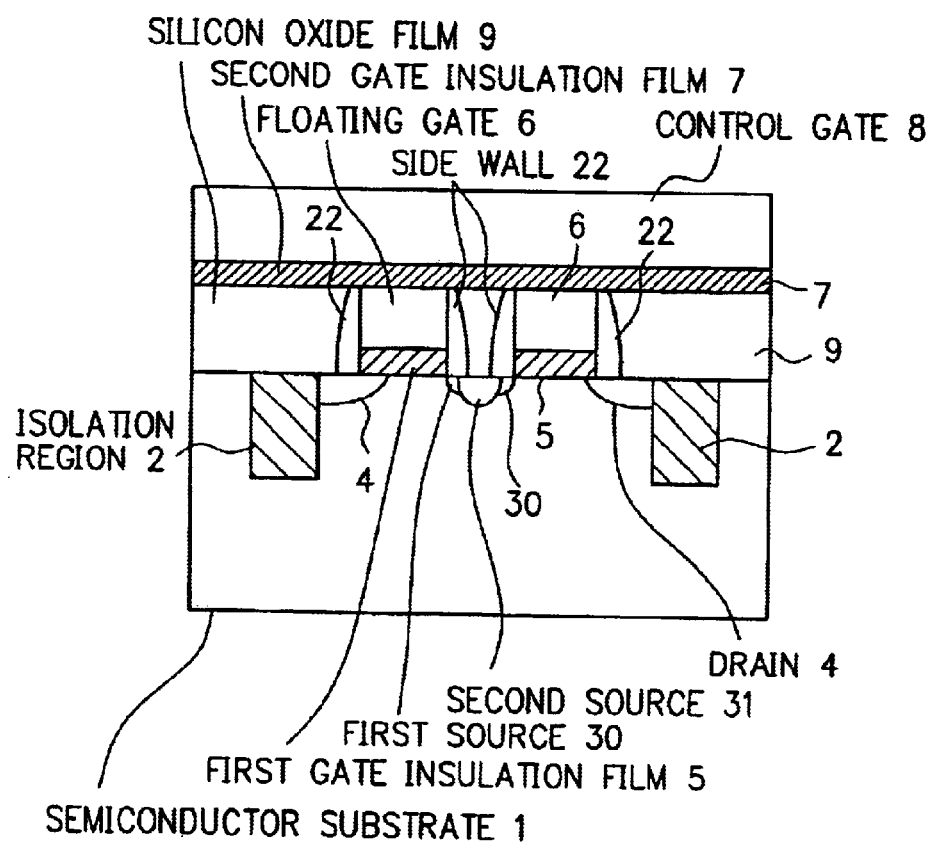
FIG. 9 is a sectional view showing a structure of a third embodiment of the non-volatile flash memory of the present invention.

Next, a third embodiment of a structure of the non-volatile flash memory of the present invention is explained. FIG. 9 is a sectional view showing the structure of the third embodiment of the non-volatile flash memory of the present invention. As shown in FIG. 9, a source is composed of first sources 30 whose impurity concentration are low and a second source 31 whose impurity concentration is high. The sources 30 are formed at a region overlapped the source and a floating gate 6, and this overlapped widths are formed to be smaller than a width overlapped drains 4 and the floating gate 6. The second source 31 is formed at a region not overlapped with the floating gate 6.

Referring to FIG. 9, a manufacturing method of the third embodiment of the present invention is explained. After the floating gates 6 are formed by the same method that the first embodiment has, the sources 30 are formed by that, for example, arsenic (As) is implanted by $5\times10^{13}$ cm$^{-2}$ on the whole surface. After this, the source region is covered with a mask, by implanting arsenic (As) by $3\times10^{15}$ cm$^{-2}$ on the whole surface, the drains 4 are formed. And a silicon oxide film is formed on the whole surface by, for example, the CVD method, and by applying an etching back, side walls 22 are formed. After this, by implanting arsenic (As) by $3\times10^{15}$ cm$^{-2}$ on the whole surface, the second source 31 is formed.

As mentioned above, at the third embodiment, since the impurity concentration of the first sources 30 are low, overlapped regions are not formed between the first sources 30 and the floating gates 6. And further, the second source 31 whose impurity concentration is high exists, therefore, there is an effect that the source resistance becoming high does not occur.

According to the structure of the non-volatile flash memory of the present invention, at a NOR type flash memory having a common source line, a region overlapped a drain and a floating gate of a memory cell is made to be large, and a region overlapped a source and the floating gate is made to be small. Therefore, at the time when data are written in the memory cell, a negative voltage is applied to a selected ward line (control gate), and the same value of a positive voltage is applied to a selected bit line (drain) and a common source line. With this, electrons can be ejected from the floating gate to the drain, without a punch-through current between the source and drain at the selected memory cell. At this time, at an adjacent memory cell, the positive voltage is applied to the source, and the negative voltage is applied to the word line (control gate), however, since the region overlapped the source and floating gate is small, electrons are not ejected from the floating gate to the source. Therefore, in case that this adjacent memory cell is an unselected memory cell, there is an effect that a data error writing to this adjacent memory cell does not occur.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A structure of a non-volatile flash memory that is a NOR type non-volatile flash memory, which provides floating gates and a common source line, wherein:
   the difference (a−b) between a region "a" overlapped one of drains and one of said floating gates in a memory cell, and a region "b" overlapped a source and one of said floating gates in said memory cell is 0.02 μm or more.

2. A structure of a non-volatile flash memory that is a NOR type non-volatile flash memory, which provides floating gates and a common source line in accordance with claim 1, wherein:

said source is composed of first sources and a second source, and said first sources and said second source are formed in a state that said first and second sources are contacted with one another, and said first sources are formed at regions overlapped with said floating gates.

3. A structure of a non-volatile flash memory that is a NOR type non-volatile flash memory, which provides floating gates and common source line in accordance with claim 2, wherein:

the impurity concentration of said second source is higher than that of said first sources.

4. A structure of a non-volatile flash memory that is a NOR type non-volatile flash memory, which provides floating gates and a common source line in accordance with claim 2, wherein:

said source composed of said first and second sources is formed in a state that said first and second sources are unified.

5. The structure of claim 1, wherein "a" is more that 0.03 $\mu$m and "b" is less than 0.01 $\mu$m.

6. The structure of claim 1, wherein (a–b) is more that 0.05 $\mu$m.

* * * * *